United States Patent
Chen et al.

(10) Patent No.: US 9,070,624 B2
(45) Date of Patent: Jun. 30, 2015

(54) SEMICONDUCTOR DEVICE INCLUDING POLYSILICON RESISTOR AND METAL GATE RESISTOR AND METHODS OF FABRICATING THEREOF

(75) Inventors: Jian-Hao Chen, Hsinchu (TW);
Chia-Yu Lu, Hsinchu (TW);
Tung-Heng Hsieh, Zhudong Town (TW); Kuo-Feng Yu, Hsinchu (TW);
Chin-Shan Hou, Hsin-Chu (TW);
Hsien-Chin Lin, Hsinchu (TW);
Shyue-Shyh Lin, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 275 days.

(21) Appl. No.: 13/328,875

(22) Filed: Dec. 16, 2011

(65) Prior Publication Data

US 2013/0157452 A1 Jun. 20, 2013

(51) Int. Cl.
*H01L 21/28* (2006.01)
*H01L 49/02* (2006.01)
*H01L 27/06* (2006.01)
*H01L 29/78* (2006.01)
*H01L 29/66* (2006.01)
*H01L 29/423* (2006.01)

(52) U.S. Cl.
CPC .......... *H01L 21/28123* (2013.01); *H01L 28/20* (2013.01); *H01L 27/0629* (2013.01); *H01L 29/78* (2013.01); *H01L 29/66545* (2013.01); *H01L 29/42376* (2013.01)

(58) Field of Classification Search
CPC ................ H01L 28/20; H01L 27/0629; H01L 21/823842; H01L 29/66545

USPC .................................. 438/197–233, 585–596
See application file for complete search history.

(56) References Cited

U.S. PATENT DOCUMENTS

| | | | | |
|---|---|---|---|---|
| 7,098,098 | B2* | 8/2006 | Johnson et al. | 438/211 |
| 7,838,366 | B2* | 11/2010 | Lin et al. | 438/275 |
| 7,977,754 | B2* | 7/2011 | Chuang et al. | 257/379 |
| 8,592,281 | B2* | 11/2013 | Kim et al. | 438/382 |
| 2007/0173025 | A1* | 7/2007 | Akamatsu | 438/305 |
| 2009/0236669 | A1* | 9/2009 | Chen et al. | 257/380 |
| 2010/0038692 | A1* | 2/2010 | Chuang et al. | 257/298 |

(Continued)

OTHER PUBLICATIONS

D. Briand, M. Sarret, F. Le Bihan, O. Bonnaud and L. Pichon; "Polysilicon In Situ Phosphorus Doping Control Over Large Concentration Range Using Low Temperature, Low Pressure Chemical Vapour Deposition Growth Process;" Nov. 1995; vol. 11; No. 11; pp. 1207-1209; Materials Science and Technology.

*Primary Examiner* — Steven J Fulk
*Assistant Examiner* — Eric Ward
(74) *Attorney, Agent, or Firm* — Haynes and Boone, LLP

(57) ABSTRACT

A described method includes providing a semiconductor substrate. A first gate structure is formed on the semiconductor substrate and a sacrificial gate structure formed adjacent the first gate structure. The sacrificial gate structure may be used to form a metal gate structure using a replacement gate methodology. A dielectric layer is formed overlying the first gate structure and the sacrificial gate structure. The dielectric layer has a first thickness above a top surface of the first gate structure and a second thickness, less than the first thickness, above a top surface of the sacrificial gate structure. (See, e.g., FIGS. 5, 15, 26). Thus, a subsequent planarization process of the dielectric layer may not contact the first gate structure.

18 Claims, 31 Drawing Sheets

(56) References Cited

U.S. PATENT DOCUMENTS

| | | | |
|---|---|---|---|
| 2010/0087038 A1* | 4/2010 | Chung et al. | 438/199 |
| 2010/0320544 A1* | 12/2010 | Tseng et al. | 257/380 |
| 2010/0327370 A1* | 12/2010 | Jan et al. | 257/380 |
| 2011/0156162 A1* | 6/2011 | Richter et al. | 257/379 |
| 2011/0241117 A1* | 10/2011 | Wei et al. | 257/355 |
| 2011/0266637 A1* | 11/2011 | Lee et al. | 257/410 |
| 2012/0043614 A1* | 2/2012 | Choi et al. | 257/369 |
| 2012/0129312 A1* | 5/2012 | Utomo et al. | 438/381 |
| 2013/0015531 A1* | 1/2013 | Kim et al. | 257/380 |
| 2013/0126976 A1* | 5/2013 | Yu et al. | 257/369 |

* cited by examiner

SEMICONDUCTOR DEVICE INCLUDING POLYSILICON RESISTOR AND METAL GATE RESISTOR AND METHODS OF FABRICATING THEREOF

BACKGROUND

The present disclosure relates generally to a semiconductor device and method of forming a semiconductor device on a substrate.

Semiconductor device geometries continue to dramatically decrease in size. Today's fabrication processes are routinely producing devices having feature dimensions less than 65 nm. However, solving the problems associated with implementing new process and equipment technology while continuing to satisfy device requirements has become more challenging. For example, metal-oxide-semiconductor (MOS) transistors have typically been formed with polysilicon gate electrodes. Polysilicon has advantageous thermal resistive properties and can allow for formation of self aligned source/drain structures. In order to continually meet performance requirements, there has been a desire to replace some of the polysilicon gate electrodes of an integrated circuit with metal gate electrodes. One process of implementing metal gates is termed a "gate last" or "replacement gate" methodology. In such a process, a dummy (e.g., sacrificial) polysilicon gate is initially formed, various processes associated with the semiconductor device are performed, and the dummy gate is subsequently removed and replaced with a metal gate.

The replacement gate process includes one or more chemical mechanical planarization (CMP) processes that can cause gate-height uniformity issues. This, in turn, may cause variation in the semiconductor device (e.g., resistor) performance. Thus, though the present methods and devices are in many ways sufficient and effective for their purposes, it is desired to improve the processes and resultant devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Similarly, relative terms such as "above" or "below" and the like are provided for ease of description only and not intended to provide an absolute orientation (e.g., the device may be flipped such that the "top" becomes the "bottom"). Various features may be arbitrarily drawn in different scales for simplicity and clarity.

Figure 1:
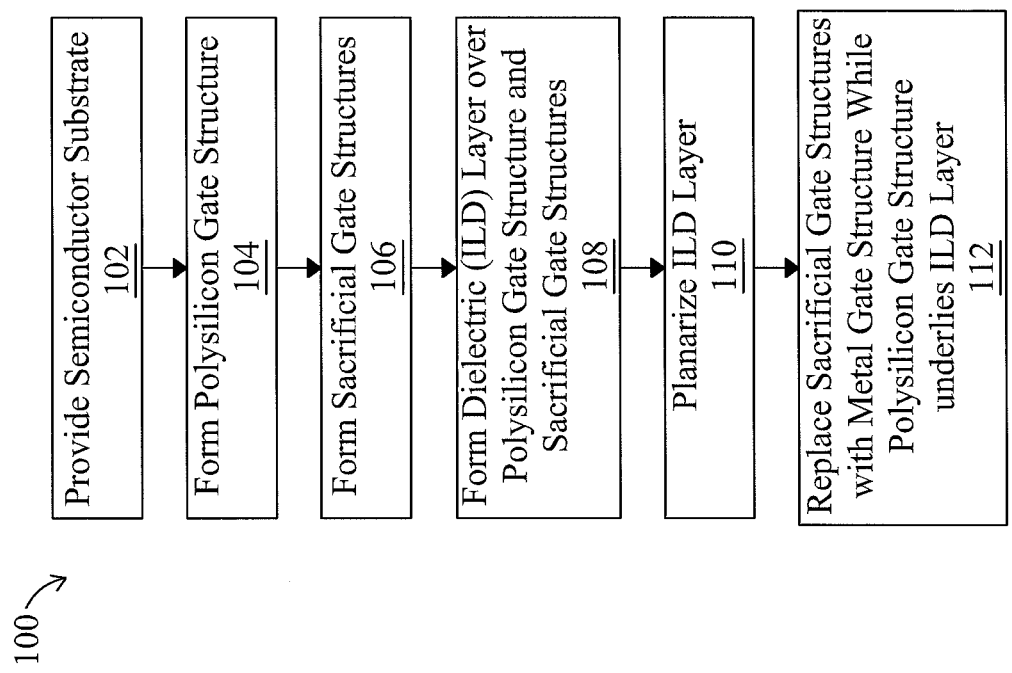
FIG. 1 is a flow chart of an embodiment of a method of fabricating a semiconductor device according to one or more aspects of the present disclosure.

Referring now to FIG. 1, illustrated is an embodiment of a method 100 of fabricating a semiconductor device. Aspects of FIG. 1 will be described in further detail in the methods of FIGS. 2 and 11. Further, it is understood that the method 100 includes steps having features of a complementary metal-oxide-semiconductor (CMOS) technology process flow and thus, are only described briefly herein. Additional steps may be performed before, after, and/or during the method 100.

The method 100 begins at block 102 where a semiconductor substrate is provided. The semiconductor substrate may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate is a semiconductor on insulator (SOI). In other alternatives, semiconductor substrate may include a doped epi layer, a gradient semiconductor layer, and/or a semiconductor layer overlying another semiconductor layer of a different type, such as a silicon layer on a silicon germanium layer. The substrate may include doped regions, such as p-wells and n-wells.

The semiconductor substrate may include isolation structures formed on the substrate for isolating the regions of the substrate. The isolation structures may be formed of silicon oxide, silicon nitride, silicon oxynitride, fluoride-doped silicate glass (FSG), a low-k dielectric material, and/or other suitable insulating material. The isolation structures may be shallow trench isolation (STI) features, local oxidation (e.g., LOCOS), and/or other suitable isolation structures. In an embodiment, the isolation structures are STI features and are formed by etching trenches in the substrate. The trenches may then be filled with isolating material, followed by a chemical mechanical polish (CMP). Active regions may interpose the isolation structures.

The method 100 then proceeds to block 104 where a gate structure is formed on the substrate. The gate structure may include a gate dielectric layer, a polysilicon or amorphous silicon gate electrode, and/or other suitable layers. In an embodiment, the gate dielectric layer is silicon dioxide. The silicon dioxide may be thermally grown oxide. The gate electrode may be formed by depositing a layer of polysilicon (or amorphous silicon). The layer of poly (or a-Si) may then be patterned and etched into one or more polysilicon gate electrodes.

The polysilicon gate structure may be formed such that its top surface is below that of the top surface of one or more sacrificial gate structures formed on the substrate, described below with reference to block 106. The top surface may be recessed as compared to the sacrificial gate structure top surface by providing a lower gate height, forming the polysilicon gate structure in a recess, and/or other embodiments. These are discussed by way of the detailed embodiments below.

The method 100 then proceeds to block 106 where sacrificial gate structures are formed. A sacrificial gate structure formed in block 106 is a dummy structure provided in the place where metal gate will be subsequently formed. This process is typically known as a gate-last or replacement gate process. Block 106 may be performed simultaneously with block 104.

The sacrificial gate structure may include a polysilicon dummy gate electrode. The dummy gate electrode material is deposited, for example, by physical vapor deposition (PVD) or chemical vapor deposition (CVD). The sacrificial gate structure may further include a gate dielectric layer underlying the polysilicon dummy gate electrode. In an embodiment, a gate dielectric is formed as part of the sacrificial gate structure and is itself a dummy (e.g., sacrificial) layer. The dummy gate dielectric may be a thermally grown oxide such as silicon dioxide (also referred to as silicon oxide). In an alternative embodiment of the method 100, the gate dielectric formed in block 106 may not be sacrificial but remain on the substrate (e.g., as in a high-k first, gate last process). In such an embodiment, the gate dielectric may be a high-k dielectric material. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods. The gate dielectric and/or the polysilicon dummy gate electrode may be formed simultaneously with the gate dielectric and/or polysilicon gate electrode of block 104.

In further processing of the method 100, in an embodiment, spacer elements are formed on the sidewalls of the sacrificial gate structure and/or the polysilicon gate structure as is known in the art. The spacer elements may include silicon nitride, silicon oxide, silicon oxynitride, and/or other suitable dielectric materials. In embodiments, the sidewall spacers include a plurality of layers, for example, liner layers. Source and drain regions (e.g., low-dose drain regions) may be formed (e.g., ion implantation) prior to the formation of the spacer elements.

In still further processing, source/drain regions may also be formed on the substrate after the spacer elements are formed. The source/drain regions may be associated with the transistors of the sacrificial gate electrode and/or other semiconductor devices formed on the substrate. The source/drain regions may be formed processes such as ion implantation, thermal diffusion, epitaxial growth, and/or other suitable processes. In embodiments, the source/drain regions include epitaxial regions formed on and/or above the substrate.

The method 100 then proceeds to block 108 where a dielectric layer is formed over the gate structures described above with reference to blocks 104 and 106. The dielectric layer may be referred to as an inter-layer dielectric (ILD) layer. The ILD layer is formed on and interposing the gate structures. The ILD layer may be formed by chemical vapor deposition (CVD), high density plasma CVD (HDP-CVD), spin-on deposition, physical vapor deposition (PVD or sputtering), or other suitable methods. The ILD layer may include silicon oxide, silicon oxynitride, a low-k material, and/or other suitable dielectric.

The method 100 then proceeds to block 110 where the dielectric layer (e.g. ILD layer) is planarized. The ILD layer may be conformably deposited on the substrate and a CMP process performed to planarize the material. The sacrificial gate structures, described above with reference to block 106, may serve as a planarization stop for the CMP process. In other words, the CMP process may be stopped at the exposure of the top surface of the sacrificial gate structure. As described above, the polysilicon gate structure, described above with reference to block 104, may have a top surface that is below that of the top surface of the sacrificial gate structure. Thus, during and at the completion of the CMP process(es) the polysilicon gate structure remains protected (e.g., encased or covered) by the ILD layer.

The method 100 then proceeds to block 112, where following a replacement gate process, the sacrificial gate structures are removed from the substrate and replaced with metal gate structures (e.g., including a metal gate electrode). The removal of the sacrificial structure provides for openings within which a metal gate will be formed, as is typically performed in a replacement gate process. The sacrificial gate structure removal may include removing a dummy gate electrode and/or a dummy gate dielectric layer. A sacrificial gate structure may be removed by an etching solution such as, for example, $NH_4OH$, dilute-HF, and/or other suitable etchant. In an alternative embodiment, the sacrificial gate structure may be removed by a suitable dry etching process. Example etchants include fluorine and/or chlorine based etchants. Exemplary processes to remove the dummy gate dielectric layer include liquid or gas phase diluted HF.

A metal gate structure may then be formed in the openings provided by the removal of the sacrificial gate structure. The metal gate structure may include interfacial layer(s), gate dielectric layer(s), work function layer(s), fill metal layer(s) and/or other suitable materials for a metal gate structure. In other embodiments, the metal gate structure may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), CVD, and/or other suitable dielectric. The gate dielectric layer may include silicon dioxide or other suitable dielectric. In an embodiment, the gate dielectric is a high-k dielectric layer. (As noted above, in alternative embodiments, the method 100 may include a gate dielectric first process where the gate dielectric formed underlying the dummy gate electrode is not removed.) The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods.

Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, PVD, and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate electrode.

During typical processes used to form the metal gate structure one or more planarization (e.g., CMP) processes are performed. It is noted that in an embodiment, during the formation of the metal gate structure (including during the CMP processing) the polysilicon gate, described above with reference to block 104, remains protected by the dielectric layer (e.g., ILD layer), described above with reference to block 108. Namely, a top surface of the polysilicon gate structure lies beneath an ILD layer such that the planarization processes do not provide contact with the polysilicon gate structure.

Thus, the method 100 of FIG. 1 provides an embodiment that allows for a reduction in gate height variability. For example, the variability of polysilicon resistors formed on a semiconductor substrate is reduced as the polysilicon gate is protected by a layer (e.g., ILD layer). Thus, the polysilicon gate is not exposed to planarization processes that may contribute to gate height variations.

Figure 2:
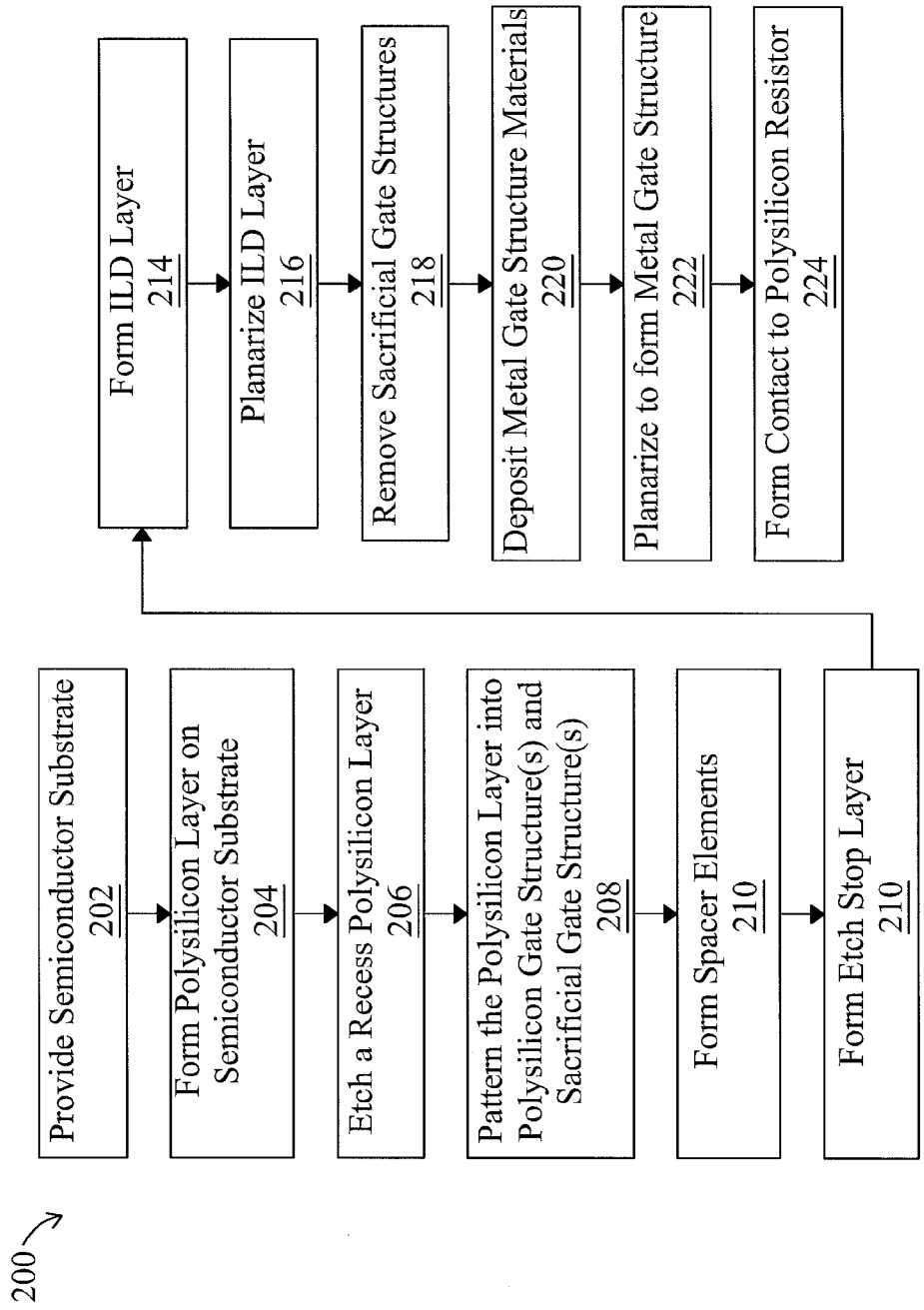
FIG. 2 is a flow chart of an embodiment of a method of the method of FIG. 1 including fabricating a semiconductor device according to one or more aspects of the present disclosure.

Referring now to FIG. 2, illustrated a method 200 for providing a polysilicon resistor in a replacement gate process. The method 200 may be an embodiment of the method 100. FIGS. 3-10 are cross-sectional views of an embodiment of semiconductor device 300 according to various stages of the method 200 of FIG. 2. It is understood that parts of the semiconductor device 300 may be fabricated by complementary metal-oxide-semiconductor (CMOS) technology process flow, and thus some processes are only briefly described herein. Further, the semiconductor device 300 may include various other devices and features, such as other types of devices such as additional transistors, bipolar junction transistors, resistors, capacitors, diodes, fuses, etc., but is simplified for a better understanding of the inventive concepts of the present disclosure. The semiconductor device 300 includes a plurality of semiconductor devices (e.g., transistors), which may be interconnected.

The method 200 begins at block 202 where a semiconductor substrate is provided. The semiconductor substrate may be substantially similar to as discussed above with reference to block 102 of the method 100. Referring to the example of FIG. 3, a semiconductor substrate 302 is illustrated. The semiconductor substrate 302 includes a plurality of isolation regions 304 interposed by active regions 306. The isolation regions 304 may be shallow trench isolation (STI) features. The isolation regions 304 may be formed of silicon oxide, silicon nitride, silicon oxynitride, fluoride-doped silicate glass (FSG), a low-k dielectric material, and/or other suitable insulating material. In an embodiment, the isolation regions 304 are formed by etching trenches in the substrate. The trenches may then be filled with isolating material, followed by a chemical mechanical polish (CMP).

The method 200 then proceeds to block 204 where a polysilicon layer is formed on the substrate. The polysilicon layer may be formed, for example, by physical vapor deposition (PVD) or chemical vapor deposition (CVD). The polysilicon layer may have a thickness between approximately 50 nanometers (nm) and approximately 120 nm. One or more layers may be formed underlying the polysilicon layer including, for example, gate dielectric layers.

In embodiments, the polysilicon layer may be doped. For example, the dopants may provide for suitable resistance (e.g., sheet-resistance (Rs) control). In an embodiment, a pre-amorphization implant (PAI) is performed. The doping may include, implanting suitable dopants by ion implantation including carbon, boron, arsenic, $BF_2$, and/or other suitable dopants.

The method 200 then proceeds to block 206 where a recess is formed in the polysilicon layer. The recess includes a region where a portion of the polysilicon layer is removed such that a region of decreased thickness of the polysilicon layer is formed. Forming the recess may include forming a masking element on a portion of the polysilicon layer, while exposing a portion of the layer where the recess will be formed. The recess may be formed by dry etch, wet etch, and/or other suitable processes. The recess dimensions and/or placement may be determined by the design constraints of the semiconductor device. The recess is formed at a region where a gate of a polysilicon gate structure will be subsequently formed, as described above.

Figure 3:
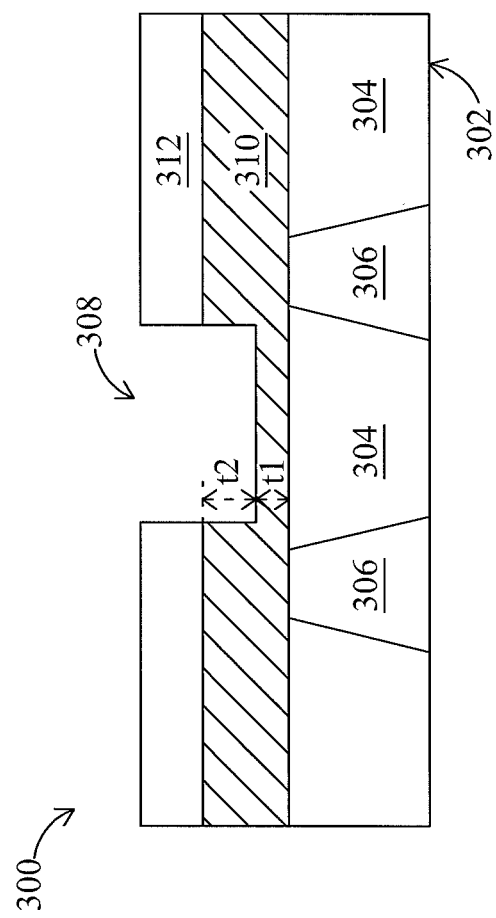
FIGS. 3-10 illustrate cross-sectional views of an embodiment of a semiconductor device corresponding to one or more of the steps of the method of FIG. 1.

Referring to the example of FIG. 3, a recess 308 is formed in a polysilicon layer 310. A masking element 312 is formed on the polysilicon layer 310 defining the region of the recess 308. In an embodiment, the masking element 312 includes photoresist. The masking element 312 may further include hard mask layers, antireflective coating layers, and/or other suitable layers known in the art.

The thinned polysilicon layer 310 provided under the recess 308 may have a thickness t1. The thickness t1 may be between approximately 10 nm and approximately 50 nm. The recess 308 in the polysilicon layer 310 may have a depth t2. The depth t2 may be between approximately 20 nm and approximately 90 nm. In a further embodiment, the depth t2 may be between approximately 30 nm and approximately 40 nm.

In an embodiment, the recess 308 is disposed over the isolation region 304. However, other embodiments including the recess 308 being disposed, in full or in part, over the active region 306 are possible.

In an embodiment, the polysilicon layer may be doped prior to the etch back process creating the recess. In an embodiment, the recess in the polysilicon layer may be formed and subsequently the recessed layer may be doped. In yet another embodiment, dopants may be introduced both before and after the recess is formed in the polysilicon layer. The doping may be performed prior to the formation of the masking element, after the formation of the masking element, and/or after the removal of the masking element. In an embodiment, a single mask defines the region for the introduction of the dopants and the region for the recess. Various configurations of doping and the formation of the recess are described below. These exemplary embodiments are not intended to be exhaustive or otherwise limiting. Further, one or more aspects of the described embodiments may be combined, and/or steps omitted, to form various additional embodiments.

In an embodiment, the polysilicon layer is formed and implanted. The implantation may include a shallow arsenic implant and/or a deep boron (B or BF2) implant across all or a portion of the polysilicon layer (e.g., at the region where the recess will be formed). Thus, the polysilicon layer may be configured to have a first As-rich portion and a second, underlying B-rich portion. In forming the recess, the etching process may be self-stopped at the B-rich region (e.g., removing the As-rich region). In such an embodiment, the polysilicon layer having a thickness t1 may be boron-rich.

In another embodiment, the formation of the polysilicon layer includes a PAI, followed by etching of the recess, and subsequently followed by an ion-implantation process. For example, a Ge PAI may be performed. The subsequent ion-implantation process may include a carbon implantation process and/or a boron (or In) implantation process. In embodiments, a polysilicon layer (or portion thereof) having an upper PAI portion, a mid C-rich portion, and an underlying B-rich portion may be formed. The amorphous silicon (PAI) portion may be removed in forming the recess (thus providing a natural etch stop layer at the underlying portion(s)). In an embodiment, the B-rich portion provides an etch stop for the layer.

In yet another embodiment, the polysilicon layer is deposited. The recess is then formed in the polysilicon layer (e.g., by a suitable etching process). A PAI process and/or suitable ion implantation may be performed on the thinned polysilicon layer. The PAI process may be a Ge PAI. The implantation may be a $BF_2$ implant, C implant, and/or other suitable dopant. The dopants may be introduced across the polysilicon layer or only at the region having the recess.

The method 200 then proceeds to block 208 where the polysilicon layer is patterned into polysilicon gate structure (s) and sacrificial gate structure(s). The polysilicon gate structures and/or sacrificial gate structures may be substantially similar to as discussed above with reference to the method 100. The patterning may be provided using lithography, etching, and/or other suitable processes known in the art.

Figure 4:
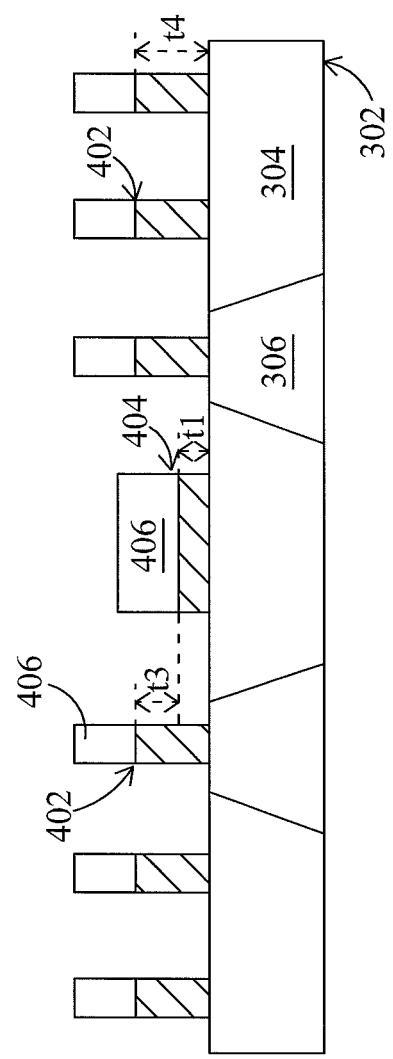

Referring to the example of FIG. 4, the polysilicon layer 310 has been patterned into a plurality of sacrificial gate structures 402 and a polysilicon gate structure 404. The polysilicon gate structure 404 includes a height t1. As described above, t1 may be between approximately 10 nm and approximately 50 nm. The polysilicon gate structure 404 may be a dummy structure (e.g., formed on the isolation region 304). However, other embodiments are possible. A patterned hard mask layer 406 is used as a masking element to form the sacrificial gate structures 402 and a polysilicon gate structure 404. The hard mask layer 406 may be silicon oxide, silicon nitride, silicon oxynitride, silicon carbide, and/or other suitable dielectric material(s). The hard mask 406 may subsequently be removed from the substrate 302.

The difference in height of the sacrificial gate structures 402 and the polysilicon gate structure 404 is illustrated as t3. In an embodiment, the height t3 is greater than approximately 25 nm. In an embodiment, the height t3 is less than approximately 80 nm. FIG. 4 illustrates the gate height of the polysilicon resistor t1 is less than the gate height of the sacrificial gate structures t4. In an embodiment, t4 is between approximately 35 nm and approximately 130 nm.

The method 200 then proceeds to blocks 210 and 212 where spacer elements and an etch stop layer are formed, respectively. The spacer elements may be substantially similar to as discussed above with reference to FIG. 1. The etch stop layer may be a contact etch stop layer (CESL). Exemplary compositions for the etch stop layer include silicon nitride, silicon oxide, silicon oxynitride, and/or other materials known in the art. The CESL may be formed by PECVD process and/or other deposition or oxidation processes known in the art.

Figure 5:
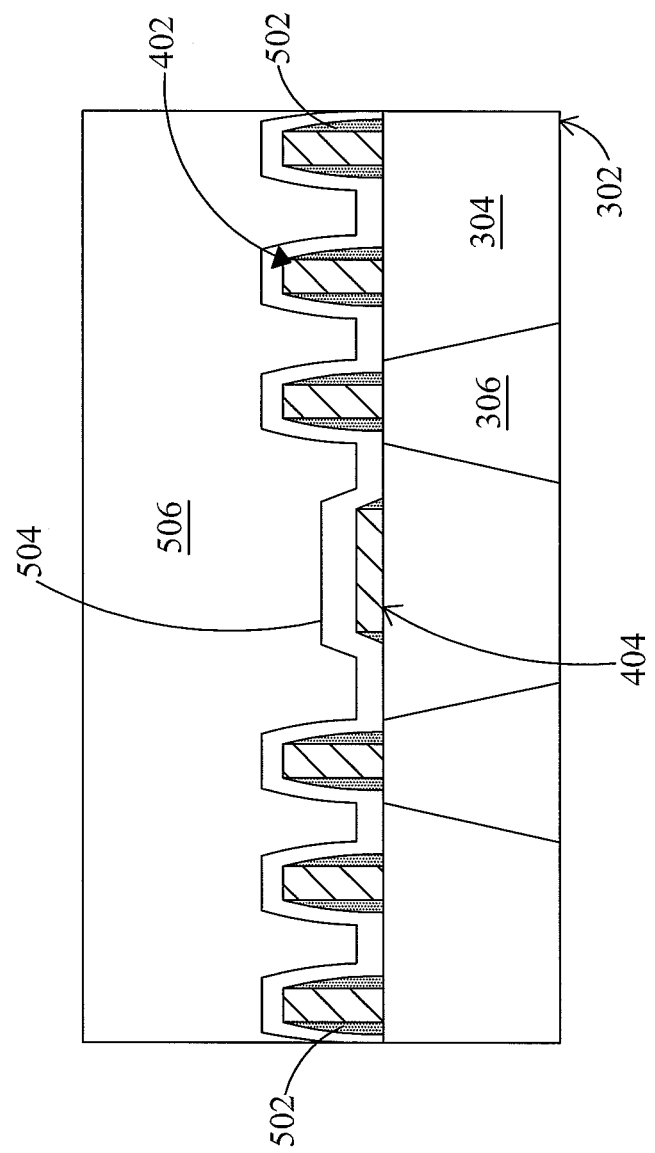
Figure 6:
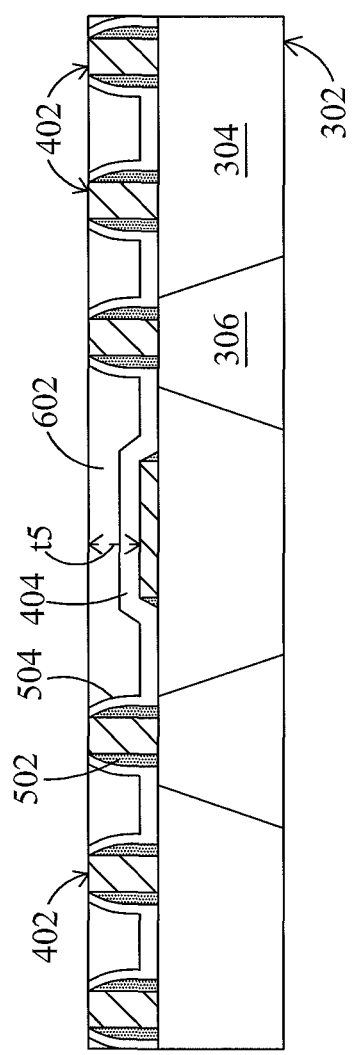

Referring to the example of FIG. 5, spacer elements 502 are formed on the sidewalls of the polysilicon gate structure 404 and sacrificial gate structures 402. A CESL 504 is disposed on the substrate 302.

The method 200 then proceeds to block 214 where a dielectric layer is formed on the substrate. The dielectric layer may be referred to as an ILD layer. The ILD layer may be substantially similar to as discussed above with reference to block 108 of the method 100. The ILD layer may be formed by chemical vapor deposition (CVD), high density plasma CVD (HDP-CVD), spin-on deposition, physical vapor deposition (PVD or sputtering), or other suitable methods. Referring again to the example of FIG. 5, an ILD layer 506 is disposed on the substrate 302 interposing and overlying the sacrificial gate structures 402 and the polysilicon gate structure 404. The ILD layer 506 may include silicon oxide, silicon oxynitride, a low-k material, and/or other suitable dielectric.

The method 200 then proceeds to block 216 where the ILD layer is planarized. The planarization may include a chemical mechanical polish (CMP) process. The planarization of the ILD layer may continue until a top surface of the sacrificial gate structures (e.g. exposing the polysilicon dummy gate electrode of the sacrificial gate structure). Referring to the example of FIG. 6, the ILD layer 506 has been planarized to form the ILD layer 602. It is noted that the polysilicon gate structure 404 is protected (covered) by the ILD layer 602. It is noted that the polysilicon gate structure 404 is also protected (covered) by the CESL layer 504. In an embodiment, the thickness t5 of the ILD layer (and the CESL layer 504) above the polysilicon gate structure 404 is between approximately 20 nm and approximately 90 nm. In a further embodiment, the thickness t5 may be between approximately 30 nm and approximately 40 nm. However, other embodiments are possible. In an embodiment, the thickness t5 is provided such that it is greater than a dishing depth caused by the CMP process of the ILD layer 506. The dishing depth may be determined by experimental data, modeling, and/or other suitable means.

The method 200 then proceeds to block 218 where the sacrificial gate structures are removed from the substrate. The removal of the sacrificial gate structures, or portion thereof, provide for opening within which a metal gate structure can be formed as part of a replacement gate process. The sacrificial gate structure removal may include removing a dummy gate electrode and/or a dummy gate dielectric layer. A sacrificial gate structure may be removed by an etching solution such as, for example, $NH_4OH$, dilute-HF, and/or other suitable etchant. In an alternative embodiment, the sacrificial gate structure may be removed by a suitable dry etching process. Example etchants include fluorine and/or chlorine based etchants. Exemplary processes to remove the dummy gate dielectric layer include liquid or gas phase diluted HF.

Figure 7:
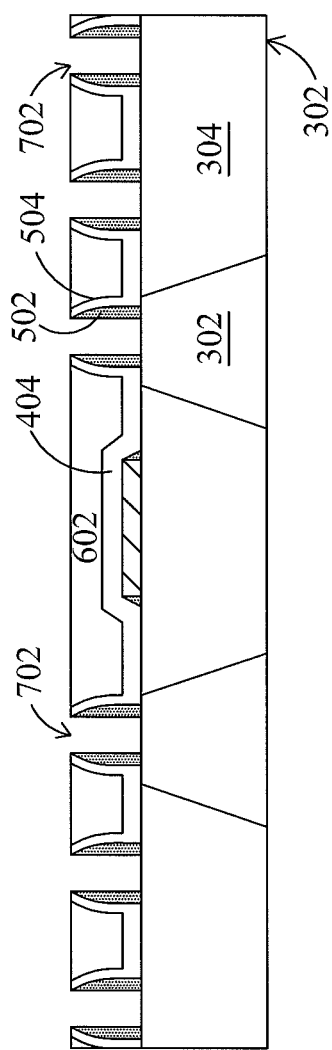
Figure 8:
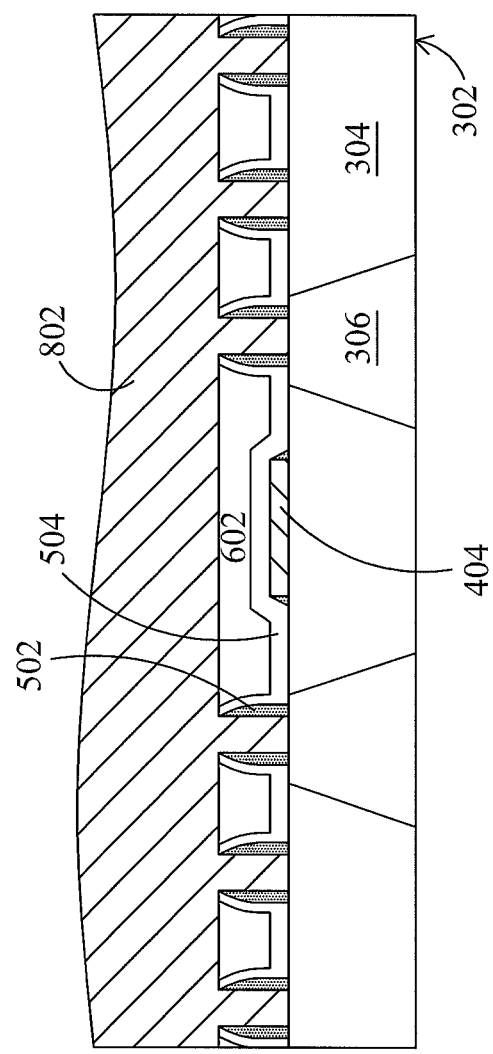
Figure 9:
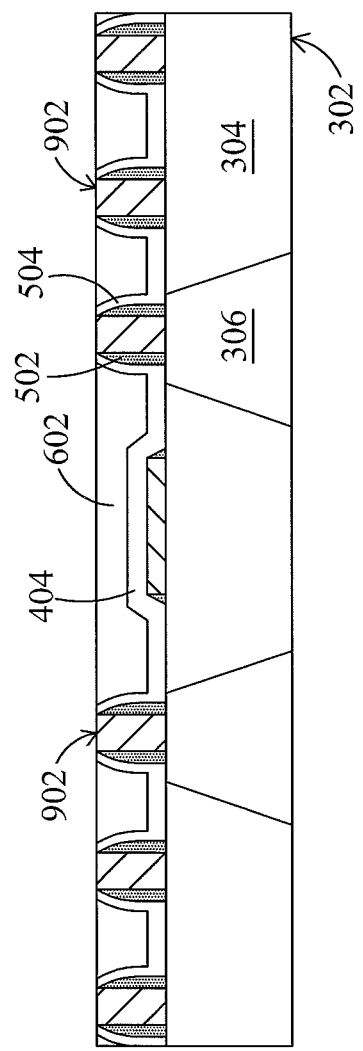
Figure 10:
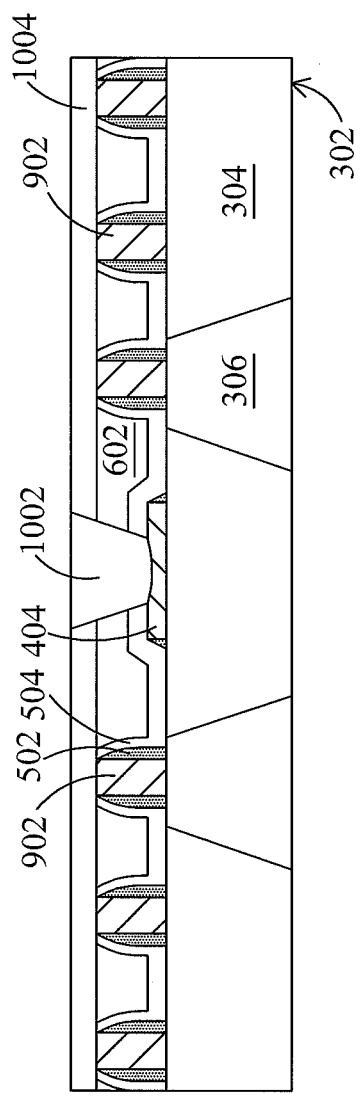

Referring to the example of FIG. 7, the sacrificial gate structures 402 (see FIGS. 4-5) have been removed providing openings 702. The removal of the sacrificial gate structures 402 may include the removal of a polysilicon dummy gate electrode and/or a dummy gate dielectric (e.g., oxide). In embodiments, the gate dielectric is not removed. It is noted that during the removal process the polysilicon gate structure 404 is protected by the ILD layer 602 and the CESL 504.

The method 200 then proceeds to block 220 where metal gate structure is formed in the openings left by the removal of the sacrificial gate structures. The formation of the metal gate structure may be substantially similar to as discussed above with reference to block 112 of the method 100. The metal gate structure may include interfacial layer(s), gate dielectric layer (s), work function layer(s), fill metal layer(s), capping layer (s), etch stop layer(s), and/or other suitable materials for a metal gate structure. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), CVD, and/or other suitable dielectric. The gate dielectric layer may include silicon dioxide or other suitable dielectric. In an embodiment, the gate dielectric is a high-k dielectric layer. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material.

One or more work function layers are formed on the gate dielectric layer. The work function layer type is determined based on the design constraints for the associated transistor (NFET or PFET). Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a desired threshold voltage Vt is achieved in the device that is to be formed in the respective region. A fill metal layer may be formed on the work function layer(s) and may include Al, W, or Cu and/or other suitable materials.

One or more of the layers of the metal gate structure (e.g., gate dielectric layer, work function layer, and fill layer) are formed on a surface of the ILD layer in addition to in the openings provided by the removal of the sacrificial gate structure. Referring to the example of FIG. 8, a metal gate material 802 is formed on the substrate 302 including in the openings 702. The metal gate material 802 may include a plurality of layers (e.g., gate dielectric layer, work function layer, and fill layer).

The method 200 then proceeds to block 222 where the metal gate material is planarized. The planarization process may include a CMP process. The planarization process may remove one or more layers of the metal gate structure material that is disposed on a top surface of the substrate (e.g., top of the ILD layer). Referring to the example of FIG. 9, the metal gate material 802 (see FIG. 8) has been planarized to form metal gate structures 902. The metal gate structure 902 may include active and/or dummy gate structures. The planarization (e.g., CMP) process stops at the top surface of the ILD layer 602. The planarization process may include an over-polish step to ensure that the ILD layer 602 is free from metal residue. During the CMP process(es) the polysilicon gate structure 404 is protected by the ILD layer 602, as well as the CESL 504.

The method 200 then proceeds to block 224 where a contact element is formed to the polysilicon gate structure. Referring to the example of FIG. 10, a contact element 1002 is formed to the polysilicon gate structure 404. The contact 1002 may be include a metal silicide such as nickel silicide, cobalt silicide, tungsten silicide, tantalum silicide, titanium silicide, platinum silicide, erbium silicide, palladium silicide, and/or combinations thereof. In an embodiment, the silicide is formed by depositing a metal layer including a metal that can form a silicide such as nickel, cobalt, tantalum, titanium, platinum, erbium, palladium, and/or tungsten. The metal may be deposited using conventional processes such as physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), or atomic layer CVD (ALCVD). The metal is then annealed to form silicide. The annealing may use a rapid thermal anneal (RTA) in a gas atmosphere such as Ar, He, $N_2$, or other inert gas. A second annealing may be required to make a stable silicide. The un-reacted metal is then removed. In an embodiment, the silicide is formed by a self-aligned silicide process (salicide process).

The contact to the polysilicon gate structure is typically formed concurrently with the contacts to one or more source/drain regions. These source/drain regions may be epitaxial raised source/drain regions. In an embodiment, these source/drain regions are associated with the metal gate structures 902. Providing contact to the source/drain regions concurrently with the contact to the polysilicon gate structure using aspects of the method 200 may be beneficial in that the same composition of layers must be etched through to open the via hole for the contact. For example, using FIG. 10 as reference a top CESL layer 1004, the ILD layer 602, and the (bottom) CESL layer 504 are each etched to provide contact to the polysilicon gate structure 404. Similarly, a top CESL layer 1004, the ILD layer 602, and the (bottom) CESL layer 504 are each etched to provide contact to a source/drain region formed on the substrate 302 (not shown).

Thus, the method 200 provides a method for protecting one or more polysilicon gate structures during planarization processes during the replacement gate process flow including the CMP process to planarize an ILD layer, such as discussed above with reference to block 216, and a CMP process to form the metal gate structures, such as discussed above with reference to block 222. It is also noted that in contrast to traditional replacement gate methodologies at least one less mask may be required. For example, typically before the sacrificial gate structure removal it is required to deposit and pattern a material (e.g., hard mask) to protect the polysilicon gate structure during the removal. This is not required in the method 200 as the polysilicon gate structure is protected by the overlying ILD layer.

Also described is a device having a polysilicon gate structure and a metal gate structure formed on the same substrate, wherein the polysilicon gate structure has a lower top surface than the metal gate structure. In embodiments, the polysilicon gate structure has the same gate dielectric material as the metal gate structures. In other embodiments, the gate dielectric material is different between the polysilicon gate structure and metal gate structure.

Figure 11:
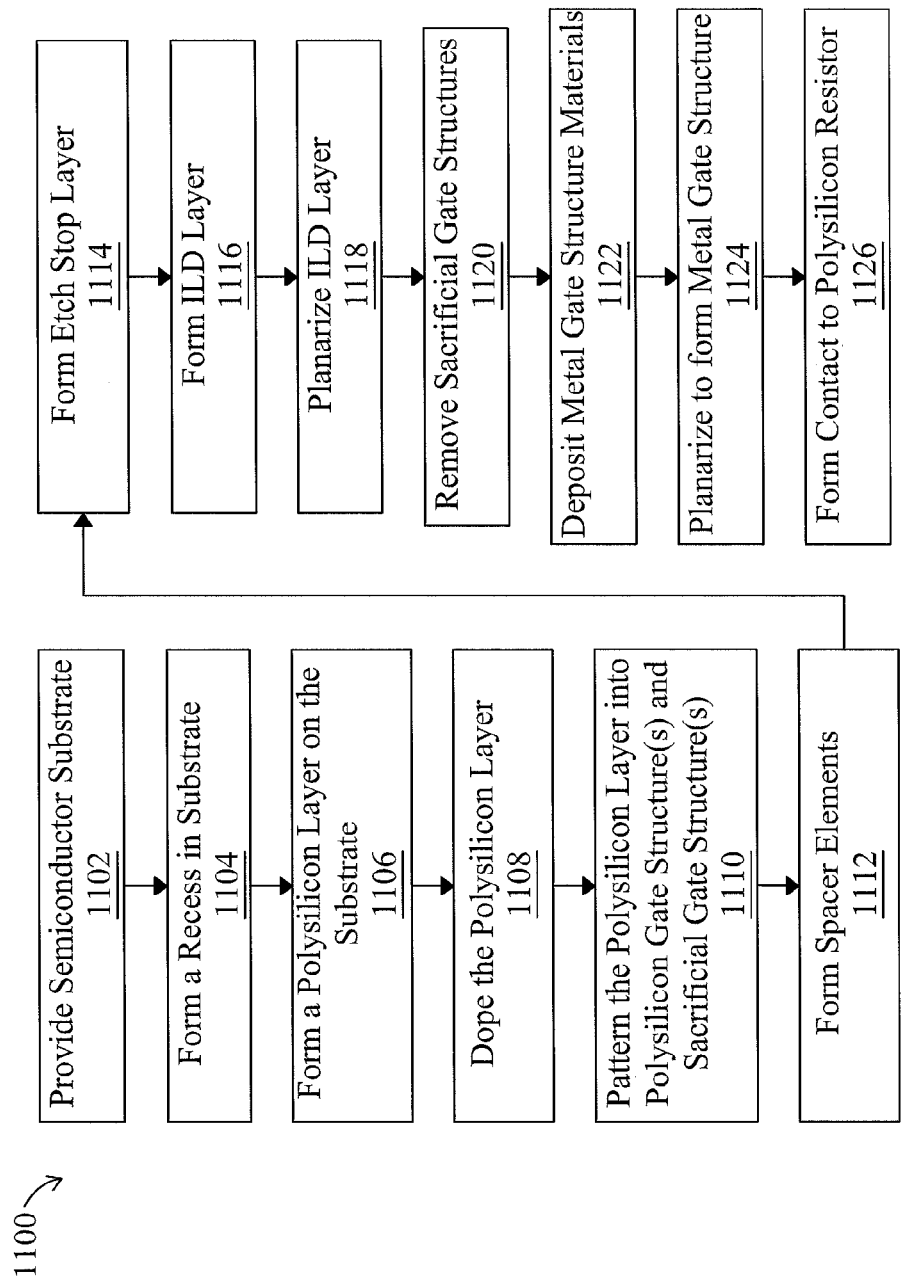
FIG. 11 is a flow chart of an embodiment of a method of the method of FIG. 1 including fabricating a semiconductor device according to one or more aspects of the present disclosure.

Referring now to FIG. 11, illustrated is an embodiment of a method 1100 for fabricating a semiconductor device having a polysilicon gate structure and metal gate structure formed on the substrate. The method 1100 may be an embodiment of the method 100, described above with reference to FIG. 1. FIGS. 12-21 provide cross-sectional views of an embodiment of a device 1200 shown at various stages of the method 1100. FIGS. 22-31 provide cross-sectional views of a device 2200 according to one or more steps of an alternative embodiment of the method 1100.

The method 1100 beings at block 1102 where a substrate is provided. The substrate may be substantially similar to as described above with reference to block 102 of the method 100. Referring to the example of FIGS. 12 and 22, the substrate 302 is illustrated having isolation regions 304 and active regions 306 formed thereon. The substrate 302, isolation regions 304 and/or active regions 306 may be substantially similar to as described above with reference to FIGS. 1, 2, and/or 3.

The method 1100 then proceeds to block 1104 where a recess is formed in the substrate. The recess includes a region of the substrate where a portion of the substrate has been removed, for example, providing a top surface lower than that of the adjacent region of the substrate. The recess may be formed by a suitable etching process such as a dry etch, wet etch, and/or combinations thereof. The recess may be formed in one or more isolation regions.

Figure 12:
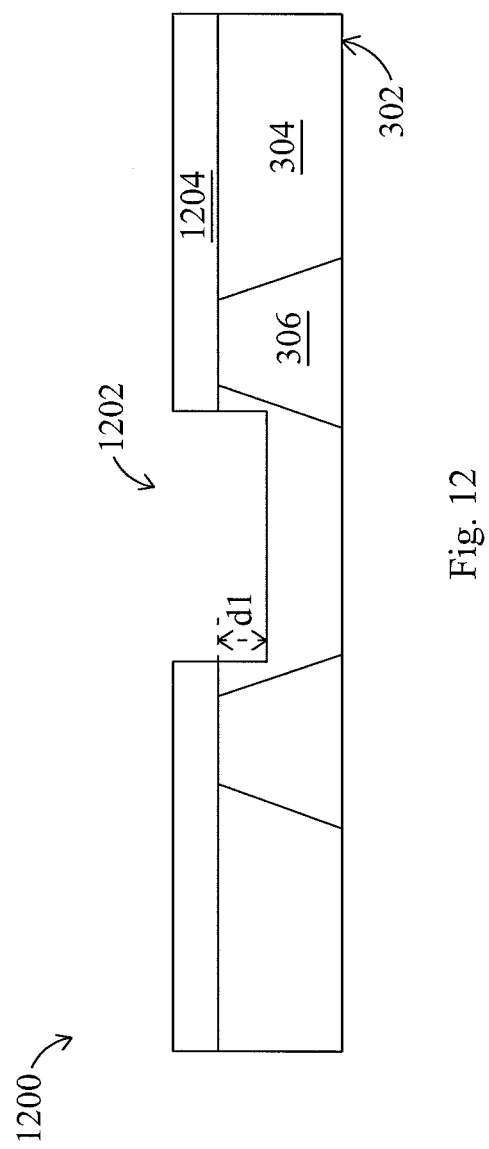
FIGS. 12-21 illustrate cross-sectional views of an embodiment of a semiconductor device corresponding to one or more of the steps of the method of FIG. 11.
Figure 13:
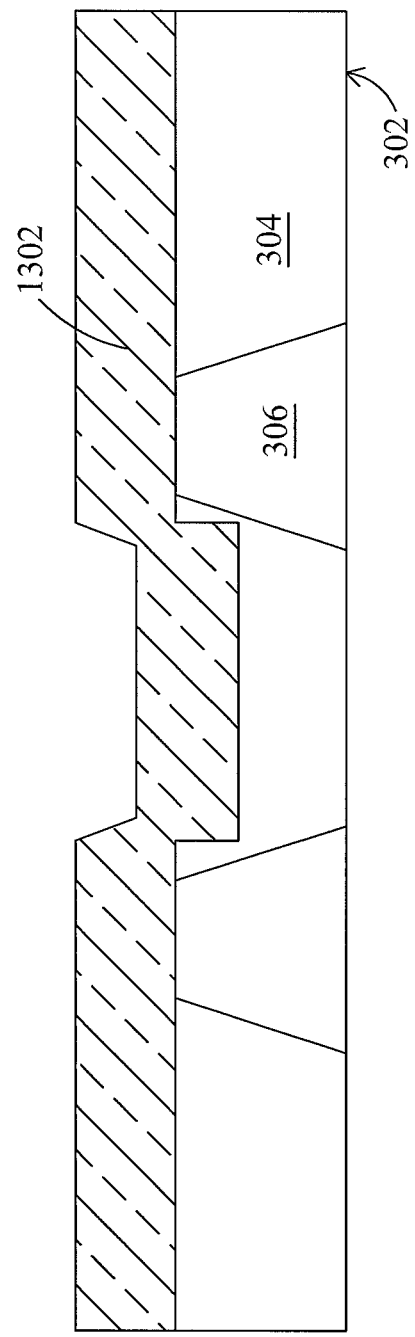

As illustrated in FIG. 12, a recess 1202 is formed in the substrate 302. The recess 1202 may be formed in an isolation region 304. The recess 1202 may have a depth d1. In an embodiment d1 is greater than approximately 20 nm. The recess 1202 may be formed using a masking element 1204 formed on the substrate 302. In an embodiment, the masking element 1204 includes photoresist. In further embodiments, the masking element 1204 may include a plurality of layers including photosensitive material, anti-reflective coatings, hard mask layers, and/or other suitable layers. The masking element 1204 may subsequently be removed from the substrate 302.

Figure 22:
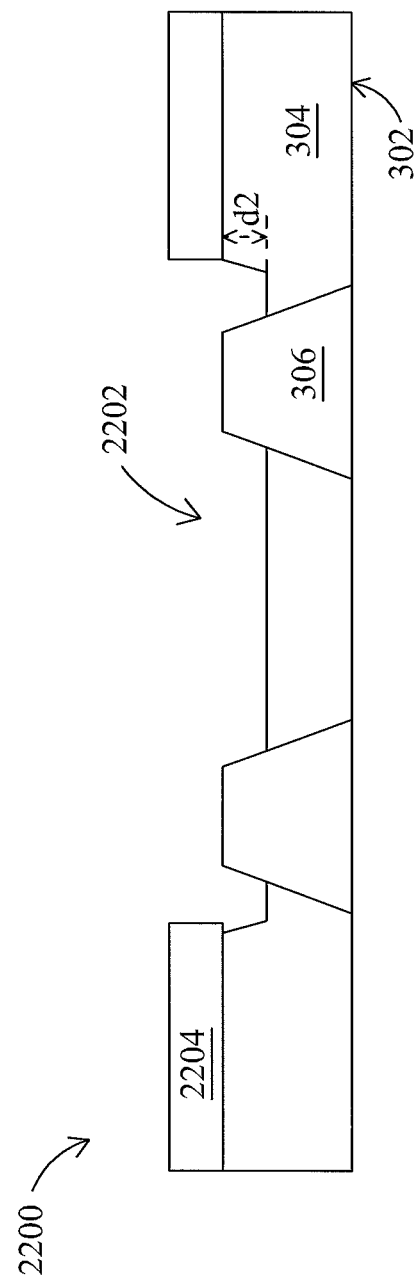
FIGS. 22-31 illustrate cross-sectional views of another embodiment of a semiconductor device corresponding to one or more steps of the method of FIG. 11.

As illustrated in FIG. 22, a recess 2202 is formed in the substrate 302. The recess 2202 may be formed in the substrate 302 and extend across multiple isolation regions 304 and/or active regions 306. The recess 2202 may have a depth d2. In an embodiment d2 is greater than approximately 20 nm. The recess 2202 may be formed using a masking element 2204 formed on the substrate 302. In an embodiment, the masking element 2204 includes photoresist. In further embodiments, the masking element 2204 may include a plurality of layers including photosensitive material, anti-reflective coatings, hard mask layers, and/or other suitable layers. The masking element 2204 may subsequently be removed from the substrate 302.

The method 1100 then proceeds to block 1106 where a polysilicon layer is formed on the substrate. The polysilicon layer may have a thickness between approximately 50 nm and approximately 120 nm. One or more layers such as gate dielectric layers may be formed on the substrate underlying the polysilicon layer. Referring to the example of FIGS. 13 and 23, a polysilicon layer 1302 is formed on the substrate 302.

Figure 14:
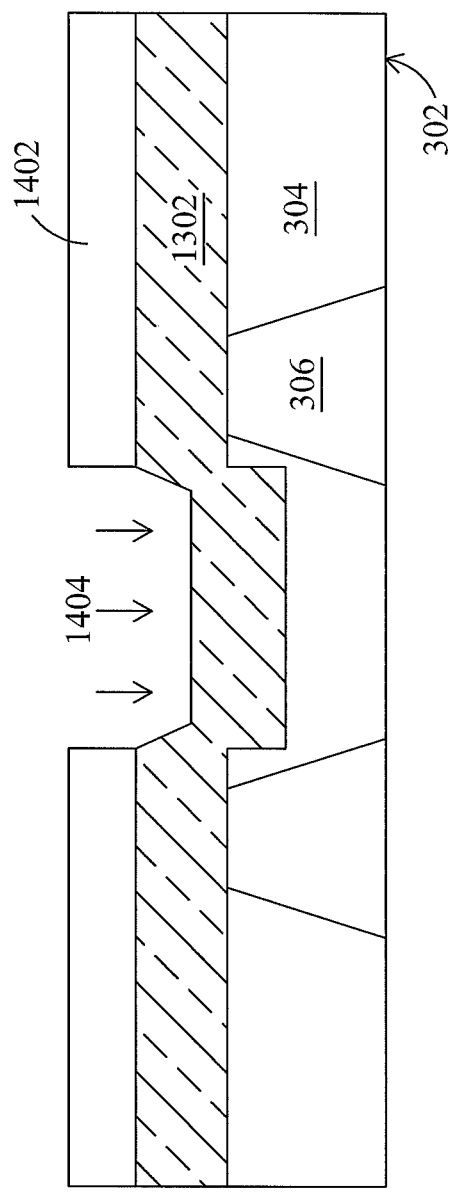

The method 1100 then proceeds to block 1108 where the polysilicon layer is doped. In other embodiments, the block 1108 may be omitted and/or dopants may be introduced in the polysilicon layer as it is deposited. The doping may include forming a masking element on the polysilicon layer and implanting selected portions of the polysilicon layer. In an embodiment, the polysilicon layer disposed in the recess of the substrate is doped. The dopants may include boron, $BF_2$, arsenic, phosphorus, carbon, and/or other suitable dopant. Referring to the example of FIG. 14, a masking element 1402 is formed on the polysilicon layer 1302. The masking element 1402 may be formed using the same photomask as the masking element 1204. FIG. 14 illustrates an implant 1404 of the polysilicon layer 1302 provided in the recess 1202.

Figure 23:
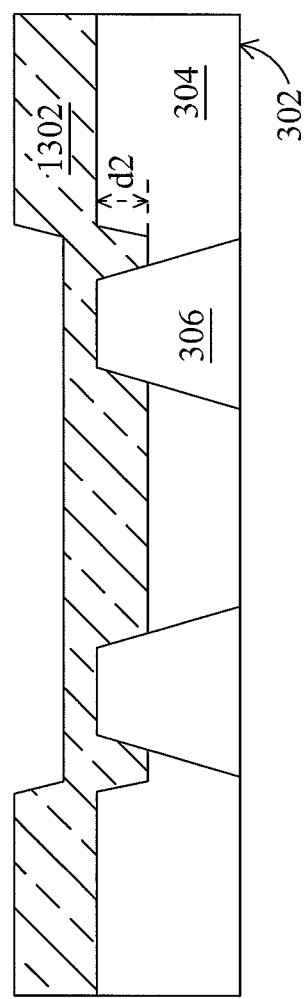

Referring to the example of FIG. 23, in an embodiment, the polysilicon layer 1302 provided on the substrate 302 of the device 2200 may be doped in-situ with its formation. In another embodiment, the polysilicon layer 1302 provided on the substrate 302 of the device 2200 may be doped after formation such as by a blanket ion-implantation process. In yet a further embodiment, a masking element may be formed allowing for doping of select areas of the polysilicon layer 1302 of the device 2200.

The method 1100 then proceeds to block 1110 where the polysilicon layer is patterned to provide a sacrificial gate structure and a polysilicon gate structure. Block 1110 may be substantially similar to as discussed above with reference to blocks 104 and/or 106 of the method 100, described above with reference to FIG. 1 and/or substantially similar to block 208 of the method 200, described above with reference to FIG. 2. The patterning may be performed using suitable lithography and etching processes.

A polysilicon gate structure may be formed in the recess (es) provided in the substrate. One or more of the sacrificial gate structures may be formed on the substrate in a region where the recess was not formed. Thus, the polysilicon gate structure is (relatively) lower than that of the sacrificial gate structures. For example, a top surface of the polysilicon gate structure is lower than the top surface of the sacrificial gate structure(s).

Figure 15:
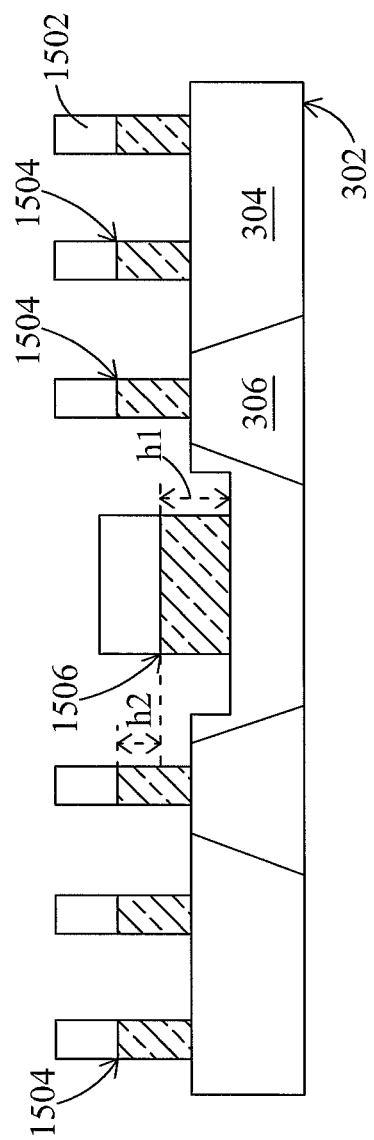
Figure 24:
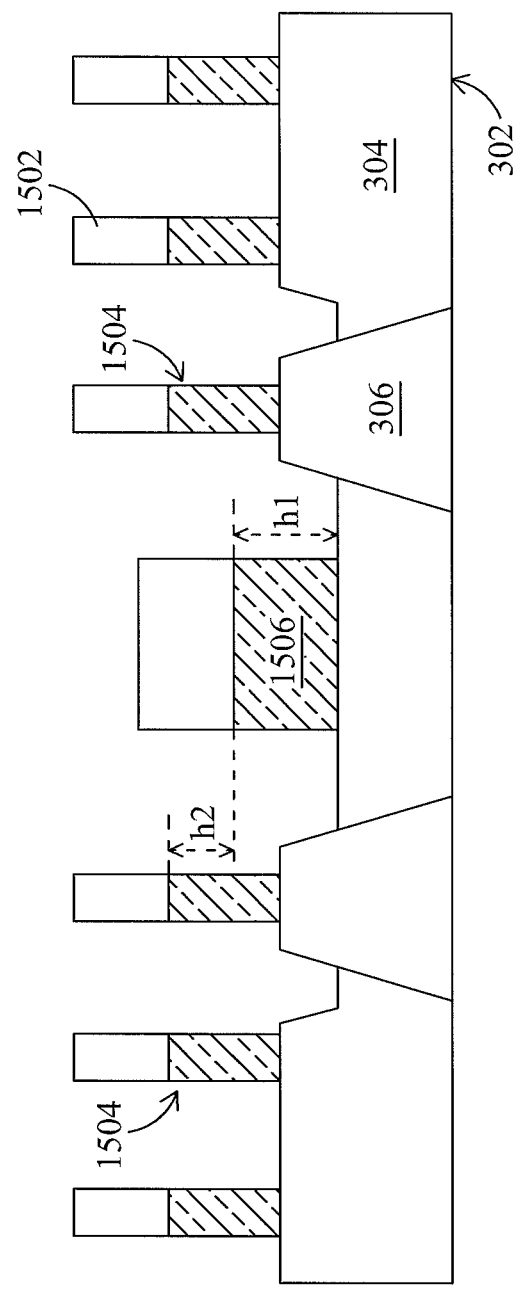
Figure 25:
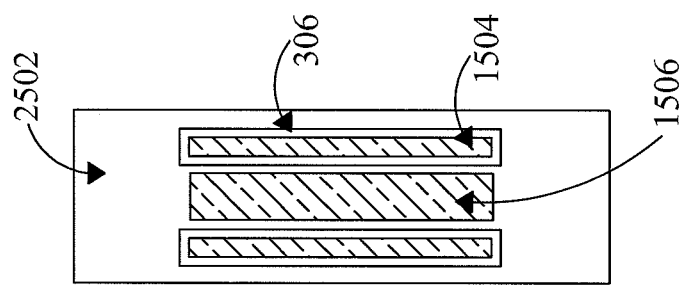

Referring to the examiner of FIGS. 15 and 24, a masking element 1502 is used to pattern a plurality of sacrificial gate structures 1504 and a polysilicon gate structure 1506. The masking element 1502 may include a hard mask material such as silicon oxide, silicon nitride, silicon oxynitride, silicon carbide, and/or other suitable hard mask materials. The sacrificial gate structures 1504 may be subsequently removed from the substrate and replaced by a metal gate structure, such as in a replacement gate process. The sacrificial gate structures may be substantially similar to the sacrificial gate structures 402 described above. The polysilicon gate structure 1506 may be substantially similar to the polysilicon gate structure 404, also described above. The polysilicon gate structure 1506 is disposed on an isolation region 304, however other embodiments are possible.

The polysilicon gate structure 1506 has a height h1. The height h1 may be between approximately 50 nm and approximately 120 nm. The polysilicon gate structure 1506 is disposed in the recess 1202. Thus, the polysilicon gate structure 1506 has a top surface which is lower than that of the adjacent sacrificial gate structures. In an embodiment, the sacrificial gate structures 1504 have a top surface that is a height h2 above the top surface of the polysilicon gate structure 1506. In an embodiment, the height h2 is between approximately 20 nm and approximately 90 nm.

The embodiment of the method 1100 illustrated in FIG. 24 may include a change to the design rules associated with the device 2200. For example, a sacrificial gate electrode is formed on an active region surrounded by the recess. In order to provide a planar surface upon which the sacrificial gate structure is formed, the active region may be defined to enclose the sacrificial gate structure. An embodiment of this is illustrated in the top-view of the device and/or layout associated with the device as FIG. 25. Element 2502 illustrates a polysilicon block area.

The method 1100 then proceeds to block 1112 where spacer elements are formed on the sidewalls of the sacrificial and polysilicon gate structures. In embodiments, processes known in the art may be performed before and/or after the spacer elements including forming source and/or gate regions. The method 1100 then proceeds to block 1114 where an etch stop layer is formed on the substrate. The etch stop layer may be a contact etch stop layer. The spacer elements and/or etch stop layer may be substantially similar to as discussed above with reference to FIGS. 1 and/or 2. Block 1112 and/or block 1114 may be substantially similar to as described above with reference to FIG. 1, and/or blocks 210 and 212, respectively, as described above with reference to the method 200 of FIG. 2.

Figure 16:
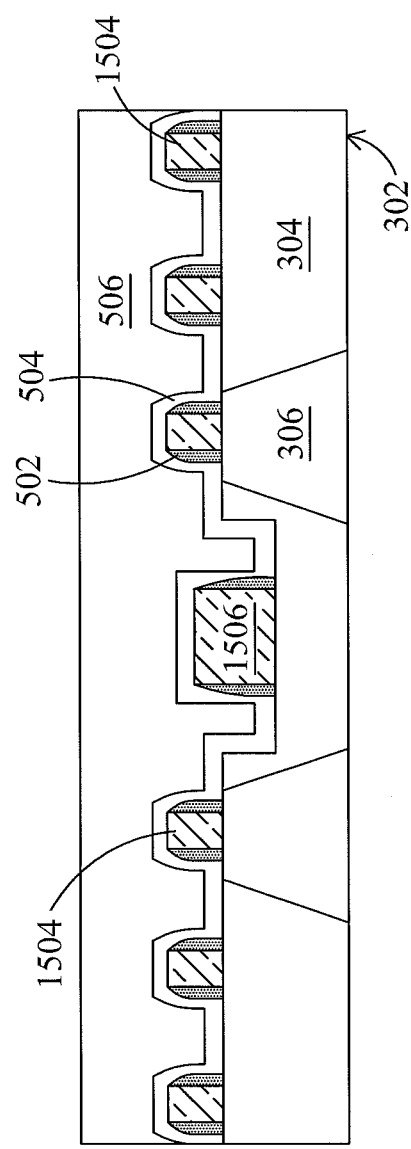
Figure 17:
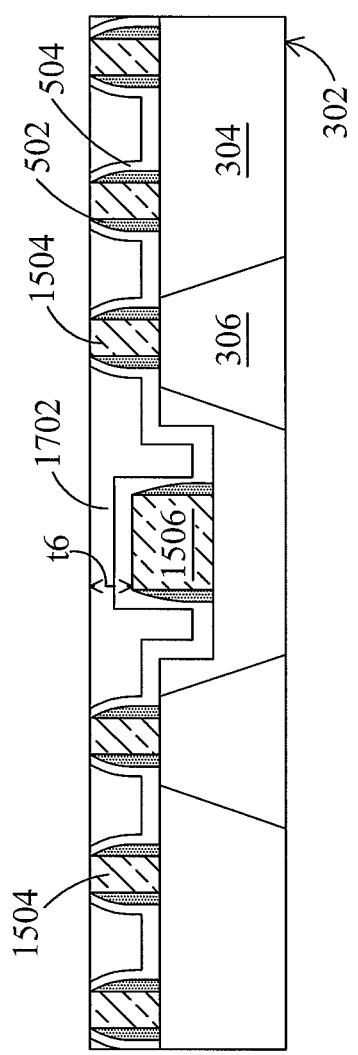
Figure 26:
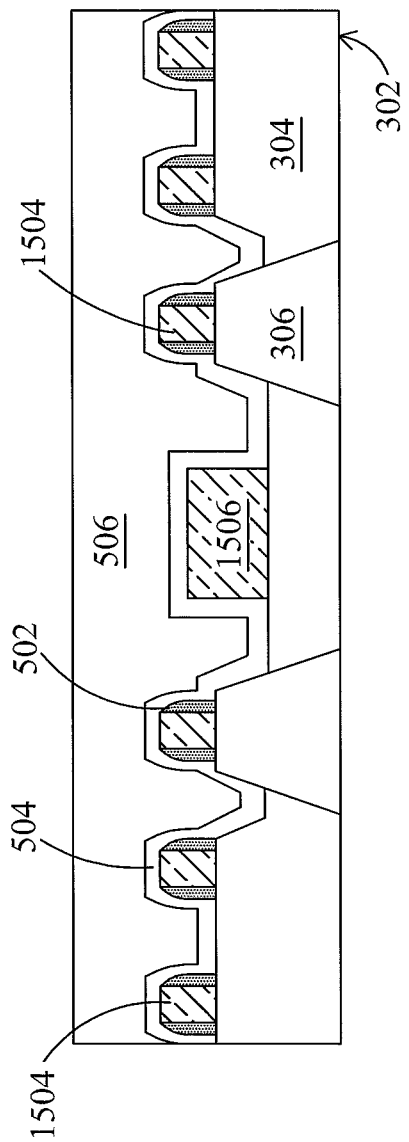
Figure 27:
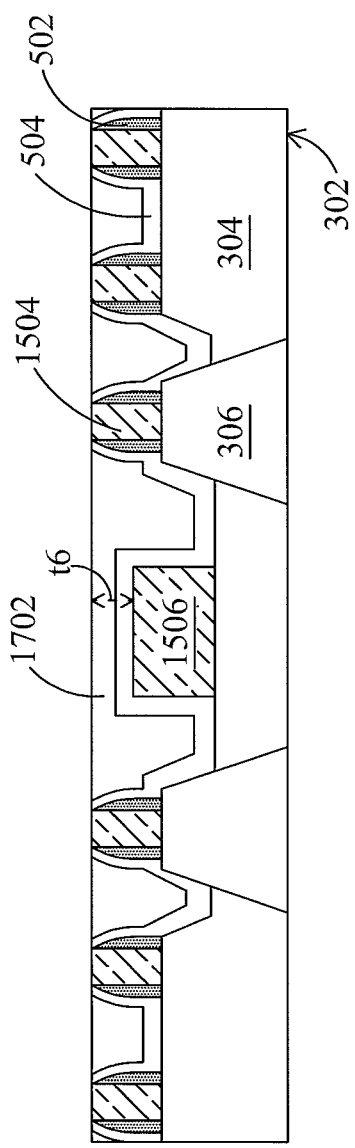

Referring to the example of FIGS. 16 and 26, spacer elements 502 are formed on the sidewalls of the polysilicon gate structure 1506 and sacrificial gate structures 1504. A CESL 504 is disposed on the substrate 302.

The method 1100 then proceeds to block 1116 where a dielectric layer is formed on the substrate. The dielectric layer may be referred to as an ILD layer. The ILD layer may be substantially similar to as discussed above with reference to block 108 of the method 100, and/or block 214 of the method 200, described above with reference to FIGS. 1 and 2, respectively. Referring to the examples of FIGS. 16 and 26, an ILD layer 506 is disposed on the substrate 302 interposing and overlying the sacrificial gate structures 1504 and the polysilicon gate structure 1506. The ILD layer 506 may include silicon oxide, silicon oxynitride, a low-k material, and/or other suitable dielectric.

The method 1100 then proceeds to block 1118 where the ILD layer is planarized. The planarization may include a chemical mechanical polish (CMP) process. The planarization of the ILD layer may continue until a top surface of the sacrificial gate structures (e.g. exposing the polysilicon dummy gate electrode of the sacrificial gate structure). Referring to the example of FIGS. 17 and 27, the ILD layer 506 has been planarized to form the ILD layer 1702. It is noted that the polysilicon gate structure 1506 is covered by the ILD layer 1702. In an embodiment, the thickness t6 of the ILD layer (and the CESL layer 504) above the polysilicon gate structure 1506 is between approximately 20 nm and approximately 90 nm. In a further embodiment, the thickness t6 may be between approximately 30 nm and approximately 40 nm. However, other embodiments are possible. In an embodiment, the thickness t6 is provided such that it is greater than a dishing depth caused by the CMP process of the ILD layer 506. The dishing depth may be determined by experimental data, modeling, and/or other suitable means.

The method 1100 then proceeds to block 1120 where the sacrificial gate structures are removed from the substrate. The removal of the sacrificial gate structures, or portion thereof, provide for opening within which a metal gate structure can be formed as part of a replacement gate process. The sacrificial gate structure removal may include removing a dummy gate electrode and/or a dummy gate dielectric layer. A sacrificial gate structure may be removed by an etching solution such as, for example, NH$_4$OH, dilute-HF, and/or other suitable etchant. In an alternative embodiment, the sacrificial gate structure may be removed by a suitable dry etching process. Example etchants include fluorine and/or chlorine based etchants. Exemplary processes to remove the dummy gate dielectric layer include liquid or gas phase diluted HF.

Figure 18:
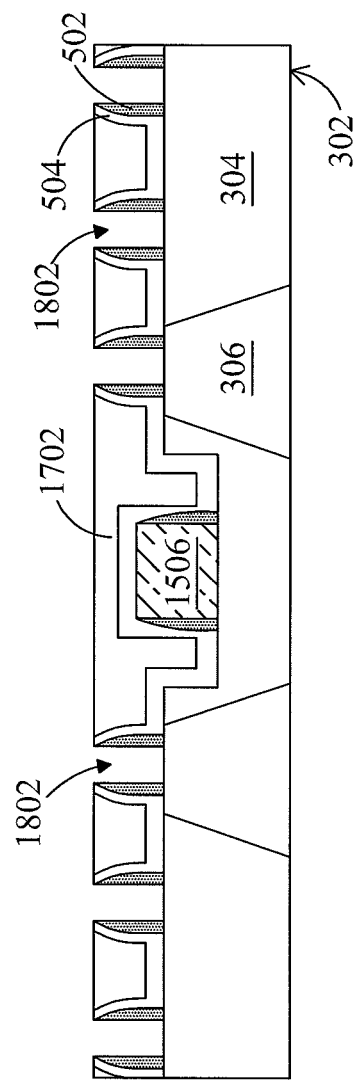
Figure 19:
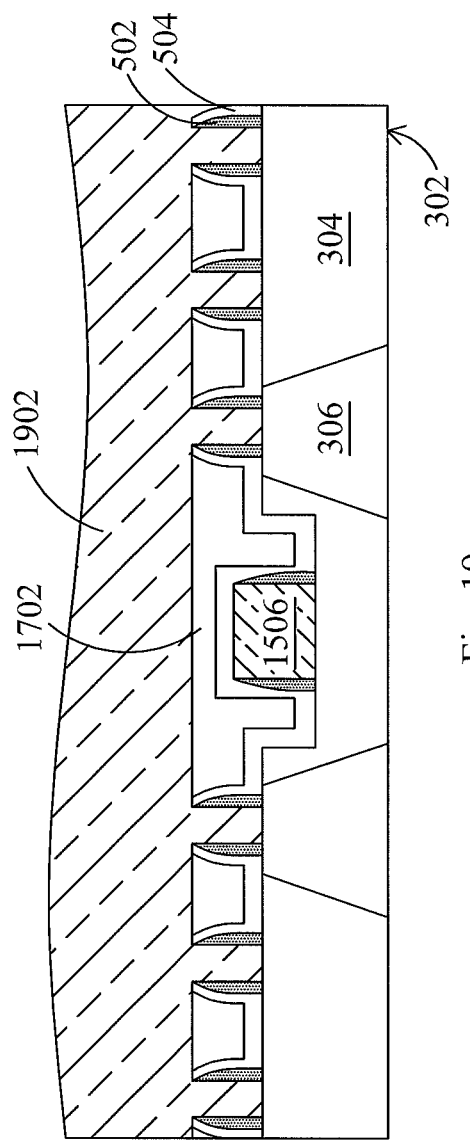
Figure 28:
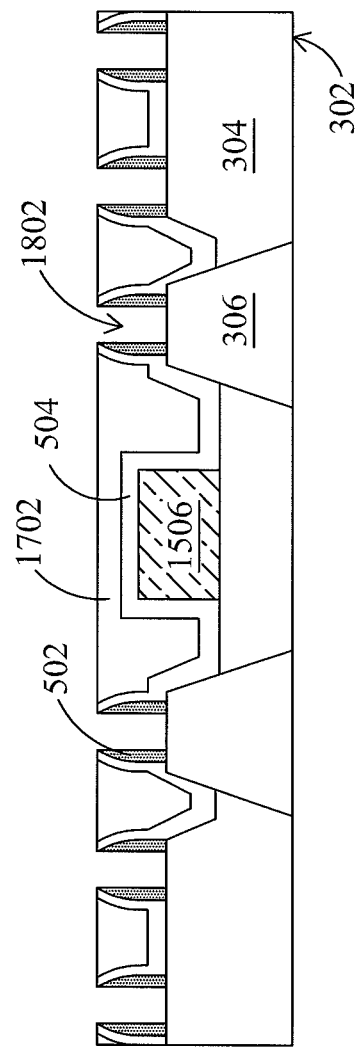
Figure 29:
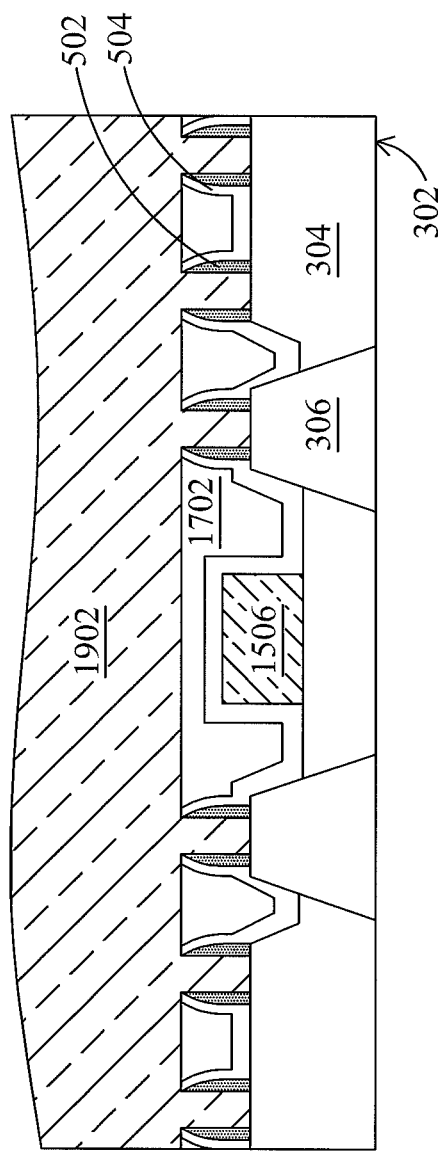

Referring to the examples of FIGS. 18 and 28, the sacrificial gate structures 1504, or portion thereof, have been removed providing openings 1802. The removal of the sacrificial gate structures 1504 may include the removal of a polysilicon dummy gate electrode and/or a dummy gate dielectric (e.g., oxide). In an embodiment, the gate dielectric formed underlying the polysilicon dummy electrode is kept on the substrate. It is noted that during the removal process the polysilicon gate structure 1506 is protected by the ILD layer 1702 and the CESL 504.

The method 1100 then proceeds to block 1122 where material to form metal gate structure is formed (e.g., deposited) in the openings left by the removal of the sacrificial gate structures. The formation of the metal gate structure may be substantially similar to as discussed above with reference to block 112 of the method 100 and/or the block 220 of the method 200, described above with reference to FIGS. 1 and 2 respectively. The metal gate structure may include interfacial layer(s), gate dielectric layer(s), work function layer(s), fill metal layer(s), capping layer(s), etch stop layer(s), and/or other suitable materials for a metal gate structure. The interfacial layer may include a dielectric material such as silicon oxide layer (SiO$_2$) or silicon oxynitride (SiON). The interfacial dielectric layer may be formed by chemical oxidation, thermal oxidation, atomic layer deposition (ALD), CVD, and/or other suitable dielectric. The gate dielectric layer may include silicon dioxide or other suitable dielectric. In an embodiment, the gate dielectric is a high-k dielectric layer. The high-k dielectric layer may include hafnium oxide (HfO$_2$). Alternatively, the high-k dielectric layer may optionally include other high-k dielectrics, such as TiO$_2$, HfZrO, Ta$_2$O$_3$, HfSiO$_4$, ZrO$_2$, ZrSiO$_2$, combinations thereof, and/or other suitable material.

One or more work function layers are formed on the gate dielectric layer. The work function layer type is determined based on the design constraints for the associated transistor (NFET or PFET). Exemplary p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a desired threshold voltage Vt is achieved in the device that is to be formed in the respective region. A fill metal layer may be formed on the work function layer(s) and may include Al, W, or Cu and/or other suitable materials.

One or more of the materials of the metal gate structure (e.g., gate dielectric layer, work function layer, and fill layer) may be formed on a surface of the ILD layer in addition to in the openings provided by the removal of the sacrificial gate structure. Referring to the example of FIGS. 19 and 29, a metal gate material 1902 is formed on the substrate 302 including in the openings 1802. The metal gate material 1902 may include a plurality of layers (e.g., gate dielectric layer, work function layer, and fill layer). The metal gate material 1902 may be substantially similar to the metal gate materials 802, described above with reference to FIG. 8.

The method 1100 then proceeds to block 1124 where the metal gate material is planarized. The planarization process may include a CMP process. The planarization process may remove one or more layers of the metal gate material that is disposed on a top surface of the substrate (e.g., top of the ILD layer). Block 1124 may be substantially similar to block 222, described above with reference to the method 200 of FIG. 2.

Figure 20:
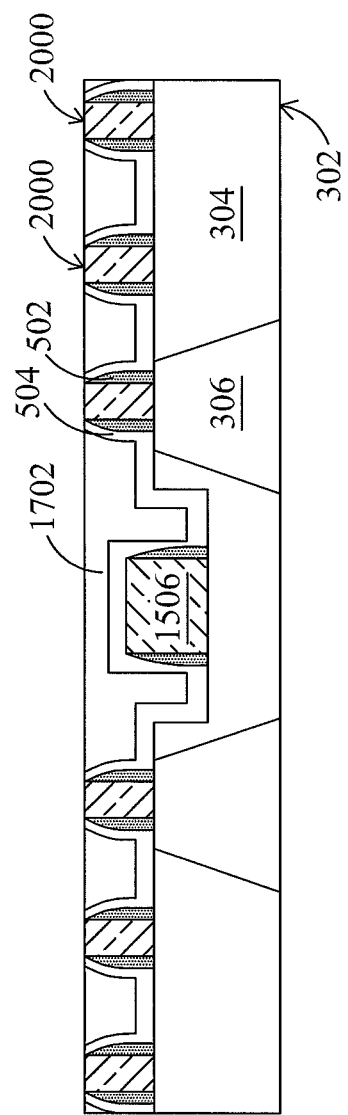
Figure 21:
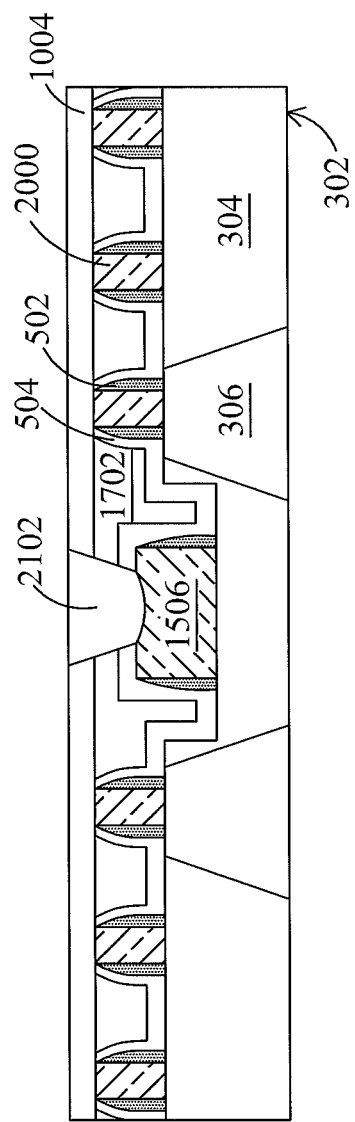
Figure 30:
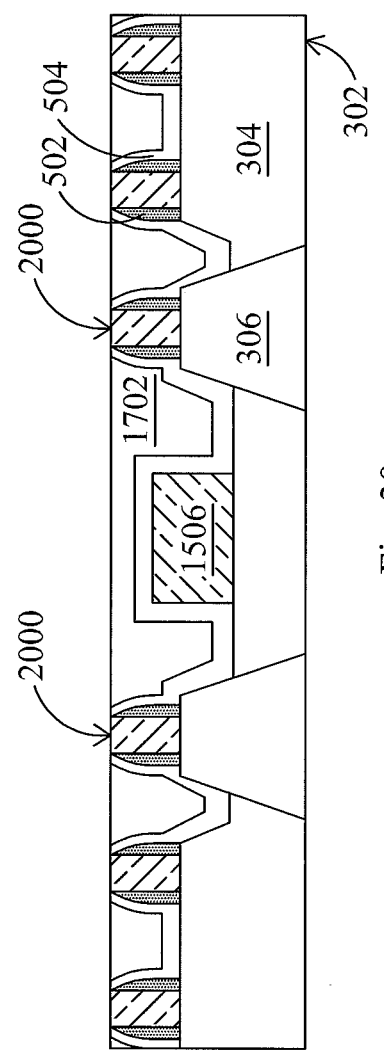
Figure 31:
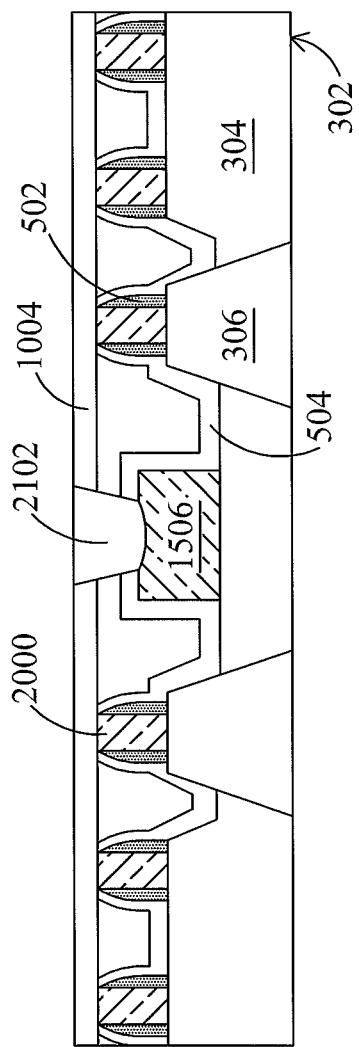

Referring to the example of FIGS. 20 and 30, the metal gate structure material 1902 (see FIGS. 19 and 29) has been planarized to form metal gate structures 2000. The metal gate structure 2000 may include active and/or dummy gate structures. The planarization (e.g., CMP) process stops at the top surface of the ILD layer 1702. The planarization process may include an over-polish step to ensure that the ILD layer 1702 is free from metal residue. During the CMP process(es) the polysilicon gate structure 1506 is protected by the ILD layer 1702, as well as the CESL 504.

The method 1100 then proceeds to block 1126 where a contact element is formed to the polysilicon gate structure. Block 1126 may be substantially similar to block 224, described above with reference to the method 200 of FIG. 2. Referring to the example of FIGS. 21 and 31, a contact element 2102 is formed to the polysilicon gate structure 1506. The contact 2102 may be include a metal silicide such as nickel silicide, cobalt silicide, tungsten silicide, tantalum silicide, titanium silicide, platinum silicide, erbium silicide, palladium silicide, and/or combinations thereof. In an embodiment, the silicide is formed by depositing a metal layer including a metal that can form a silicide such as nickel, cobalt, tantalum, titanium, platinum, erbium, palladium, and/or tungsten. The metal may be deposited using conventional processes such as physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), or atomic layer CVD (ALCVD). The metal is then annealed to form silicide. The annealing may use a rapid thermal anneal (RTA) in a gas atmosphere such as Ar, He, $N_2$, or other inert gas. A second annealing may be used to make a stable silicide. The un-reacted metal is then removed. In an embodiment, the silicide is formed by a self-aligned silicide process (salicide process).

The contact to the polysilicon gate structure is typically formed concurrently with the contacts to one or more source/drain regions. These source/drain regions may be epitaxial raised source/drain regions. In an embodiment, these source/drain regions are associated with the metal gate structures 2000. Providing contact to the source/drain regions concurrently with the contact to the polysilicon gate structure using aspects of the method 1100 may be beneficial in that the same composition of layers must be etched through to open the via hole for the contact. For example, using FIGS. 21 and/or 31 as reference, a top CESL layer 1004, the ILD layer 1702, and the (bottom) CESL layer 504 are each etched to provide contact to the polysilicon gate structure 1506. Similarly, the top CESL layer 1004, the ILD layer 1702, and the (bottom) CESL layer 504 are each etched to provide contact to a source/drain region formed on the substrate 302 (not shown).

Thus, the method 1100 provides a method for protecting one or more polysilicon gate structures during planarization processes during the replacement gate process flow including the CMP process to planarize an ILD layer, such as discussed above with reference to block 1118, and a CMP process to form the metal gate structures, such as discussed above with reference to block 1124. The recess formed within which the polysilicon gate structure is formed may be disposed within a single isolation region or may extend into multiple isolation regions. It is also noted that in contrast to traditional replacement gate methodologies at least one less mask may be required. For example, typically before the sacrificial gate structure removal it is required to deposit and pattern a material (e.g., hard mask) to protect the polysilicon gate structure during the removal. This is not required in the method 1100 as the polysilicon gate structure is protected by the overlying ILD layer.

Also described is a device having a polysilicon gate structure and a metal gate structure formed on the same substrate, wherein the polysilicon gate structure has a lower top surface than the metal gate structure. The polysilicon gate structure also has a lower bottom surface (e.g., gate dielectric layer) than the metal gate structure as it is formed in a recess in the substrate. In embodiments, the polysilicon gate structure has the same gate dielectric material as the metal gate structures. In other embodiments, the gate dielectric material is different between the polysilicon gate structure and metal gate structure.

In summary, the methods and devices disclosed herein provide embodiments of forming a polysilicon resistor on a substrate with metal gate resistors formed by a replacement gate methodology. In doing so, embodiments of the present disclosure offer several advantages over prior art devices. These include, for example, protecting the polysilicon resistor from planarization and other processes used to form the metal gate structures. This protection allows an increase in uniformity of the polysilicon resistor (e.g., less variation in gate height). Various manners of protecting the polysilicon resistor are described. For example, the resistor may be protected by an overlying ILD layer as the polysilicon resistor has a decreased gate height in comparison with the structures used to form the metal gate structures. As another example, the polysilicon gate structure may be formed in a recess in the substrate such that the polysilicon resistor may be protected by an overlying ILD layer. It is understood that different embodiments disclosed herein offer different disclosure, and that they may make various changes, substitutions and alterations herein without departing from the spirit and scope of the present disclosure.

What is claimed is:

1. A method, comprising:
   forming a polysilicon layer on a semiconductor substrate;
   etching the polysilicon layer to form a first region having a first height from a top surface of the semiconductor substrate and a second region having a second height from the top surface of the semiconductor substrate, wherein the second height is less than the first height;
   forming a first gate structure on the semiconductor substrate, wherein the first gate structure is formed of the second region of the etched polysilicon layer and is disposed over an isolation region of the substrate;
   forming a sacrificial gate structure on the semiconductor substrate adjacent the first gate structure, wherein the sacrificial gate structure is formed using the first region of the etched polysilicon layer and is disposed over an active region of the substrate adjacent the isolation region; and
   forming a dielectric layer overlying the first gate structure and the sacrificial gate structure, wherein the dielectric layer has a first thickness above a top surface of the first gate structure and a second thickness above a top surface of the sacrificial gate structure, wherein the second thickness is less than the first thickness;
   after forming the dielectric layer, performing a planarization process on the dielectric layer to expose the top surface of the sacrificial gate structure, wherein after performing the planarization process a portion of the dielectric layer having a third thickness remains above the first gate structure;
   after the planarization process, removing the sacrificial gate structure to form a trench;
   forming a metal gate structure in the trench; and
   forming a first contact to the first gate structure and forming a second contact to the metal gate structure.

2. The method of claim 1, further comprising:
   depositing a layer of gate dielectric material underlying the layer of polysilicon.

3. The method of claim 1, further comprising:
   doping the layer of polysilicon wherein the doping includes a germanium pre-amorphous implant (PAI).

4. The method of claim 3, wherein the doping is performed while a masking element is disposed on the first region of the layer of polysilicon and prior to the etching of the layer of polysilicon.

5. The method of claim 1, wherein the first thickness is greater than the second thickness by at least approximately 25 nanometers.

6. The method of claim 1, wherein the forming the first contact includes forming the first contact interfacing a top surface of the first gate structure and forming the second contact includes forming the second contact interfacing a top surface of the metal gate structure, wherein the top surface of the first gate structure has a first height above the top surface of the semiconductor substrate and the top surface of the metal gate structure has a second height above the top surface of the semiconductor substrate, wherein the second height is greater than the first height.

7. The method of claim 1, further comprising:
doping the polysilicon layer prior to the etching, wherein the doping includes performing a shallow implant of arsenic to form an arsenic-rich upper region and performing a deeper implant of boron in the polysilicon layer to form a boron-rich lower region; and
using the lower region as an etch-stop for the etching the polysilicon layer.

8. A method, comprising:
providing a substrate having a first surface;
forming a recess in an isolation region of the substrate, thereby providing a recessed region having a second surface of dielectric material spaced a distance from the first surface, wherein the recess is defined by a first sidewall edge of dielectric material and an opposing second sidewall edge of dielectric material, wherein first and second active regions having a top surface of the first surface interpose the first sidewall edge and second sidewall edge such that the recess having the second surface is disposed between the first and second active regions and on opposing sides of each of the first and second isolation features;
forming a polysilicon gate structure in the recess on the second surface and interposing the first and second active regions;
forming a first sacrificial gate structure on the first surface in the first active region;
forming a second sacrificial gate structure on the first surface in the isolation region and adjacent the second sidewall edge of the recess; and
forming a dielectric layer overlying the polysilicon gate structure, the first sacrificial gate structure and the second sacrificial gate structure.

9. The method of claim 8, further comprising:
planarizing the dielectric layer until a top surface of the first and second sacrificial gate structures are exposed and a portion of the dielectric layer remains overlying the polysilicon gate structure.

10. The method of claim 9, further comprising:
after planarizing the dielectric layer, removing the first sacrificial gate structure to form a first opening and the second sacrificial gate structure to form a second opening; and
forming a metal gate electrode in the first opening and in the second opening.

11. The method of claim 8, wherein the recess is greater than approximately 25 nm in depth.

12. The method of claim 8, further comprising:
forming a contact etch stop layer (CESL) on the polysilicon gate structure and the first sacrificial gate structure, wherein the CESL underlies the dielectric layer.

13. The method of claim 8, wherein the first and second active regions each have a top surface that is substantially co-planar with the first surface of the substrate.

14. A method, comprising:
providing a substrate having a polysilicon layer;
doping the polysilicon layer, wherein the doping includes a shallow implant of a first dopant type and a deep implant of a second dopant type, thereby forming a top portion of the polysilicon being a first dopant type-rich portion and an underlying portion of the polysilicon being a second dopant type-rich portion;
etching a recess in the polysilicon layer, after the doping, to provide a first portion having a first thickness and a second portion having a second thickness, the second thickness being less than the first thickness, wherein the etching the recess includes using the second dopant type-rich portion of the polysilicon layer as an etch stop;
after etching the polysilicon layer, patterning the polysilicon layer to form a first gate structure and a second gate structure, wherein the first gate structure is formed in the first portion of the polysilicon and the second gate structure is formed in the second portion of the polysilicon layer;
removing the first gate structure to form an opening;
forming a metal gate structure in the opening; and
forming contacts to each of the metal gate structure and the second gate structure.

15. The method of claim 14, wherein the
second dopant type is boron and creates a boron-rich underlying portion of the polysilicon layer.

16. The method of claim 14, wherein the second thickness is between approximately 25 nanometers and approximately 80 nanometers less than the first thickness.

17. The method of claim 14, further comprising:
forming an inter-layer dielectric (ILD) layer on the first and second gate structures, wherein the ILD layer has a third thickness above the first gate structure and a fourth thickness above the second gate structure, the fourth thickness being greater that the third thickness.

18. The method of claim 14, wherein the first dopant type is arsenic and creates an arsenic-rich top portion of the polysilicon layer.

* * * * *